(12) United States Patent
Dervay et al.

(10) Patent No.: US 11,683,042 B1
(45) Date of Patent: Jun. 20, 2023

(54) LOW NOISE INFINITE RADIO FREQUENCY DELAY-LOCKED LOOP

(71) Applicant: Raytheon Company, Waltham, MA (US)

(72) Inventors: James Dervay, Franklin, MA (US); Gary Ian Moore, Andover, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/659,911

(22) Filed: Apr. 20, 2022

(51) Int. Cl.
*H03L 7/081* (2006.01)
*H03L 7/093* (2006.01)
*H03L 7/099* (2006.01)

(52) U.S. Cl.
CPC ............ *H03L 7/0812* (2013.01); *H03L 7/093* (2013.01); *H03L 7/099* (2013.01)

(58) Field of Classification Search
CPC ........ H03L 7/099; H03L 7/093; H03L 7/0812
USPC ........... 331/57, 154, 134; 327/156, 153, 141
See application file for complete search history.

(56) References Cited

U.S. PATENT DOCUMENTS

2015/0222287 A1* 8/2015 Tekin ........................ H04L 7/02
341/110

OTHER PUBLICATIONS

U.S. Appl. No. 17/546,662, filed Dec. 9, 2021, Moore.
Bae et al., "A VCDL-Based 60-760-MHz Dual-Loop DLL With Infinite Phase-Shift Capability and Adaptive-Bandwidth Scheme;" Proceedings of IEEE Journal of Solid-State Circuits, vol. 40, No. 5; May 2005; 11 Pages.
Chen et al., "An Infinite Phase Shift Delay-Locked Loop With Voltage-Controlled Sawtooth Delay Line;" Proceedings of IEEE Journal of Solid-State Circuits, vol. 43, No. 11; Nov. 2008; 9 Pages.
Jung et al., "A Dual-Loop Delay-Locked Loop Using Multiple Voltage-Controlled Delay Lines;" Proceedings of IEEE Journal of Solid-State Circuits, vol. 36, No. 5; May 2001; 8 Pages.

* cited by examiner

*Primary Examiner* — Arnold M Kinkead
(74) *Attorney, Agent, or Firm* — Daly Crowley Mofford & Durkee, LLP (57) ABSTRACT

Described herein is an apparatus and a method for a low noise infinite radio frequency (RF) delayed-locked loop (DLL). The apparatus comprises a phase detector having a first input configured to receive a first RF signal, a second input, and an output; an infinite phase shifter having a first input configured to receive a second RF signal, an input bus, and an output connected to the second input of the phase detector; and a controller having a first input connected to the output of the phase detector and an output bus connected to the input bus of the infinite phase detector, wherein the output of the infinite phase shifter comprises a low noise signal in phase alignment with the first RF signal.

16 Claims, 7 Drawing Sheets

LOW NOISE INFINITE RADIO FREQUENCY DELAY-LOCKED LOOP

BACKGROUND

In sophisticated radio frequency (RF) and microwave systems it is often desirable to achieve precise phase alignment between two or more carrier signals such as those produced by oscillators. This enables distributed clock synchronization or the coherent combination of carrier signals for effective phase noise reduction. Maintaining such RF phase alignment typically involves using one or more phase-locked loop (PLL) architectures.

Common PLL design practice considers a voltage-controlled oscillator (VCO) as part of a feedback loop with characteristics of the PLL such as loop filter bandwidth and voltage swing being tailored to the specific oscillator's characteristics such as tuning slope (HZ/V) and tuning-voltage input range.

Delay-locked loops (DLLs) offer the advantage of being applicable to signal sources other than a voltage-controlled oscillators and their design can be source-agnostic. Conventional DLLs have a limited delay range, which can make them difficult to setup and susceptible to a loss of lock unless the source characteristics are tightly constrained. DLLs offering "infinite" delay (phase shift) overcome these difficulties, but these do not operate to microwave frequencies, may induce additive phase noise, have at least two loops, and/or require a plurality of pulse-to-sawtooth converters.

SUMMARY

In accordance with the concepts described herein, example infinite RF DLL devices and methods provide phase alignment of RF signals for noise cancellation or distributed clock synchronization.

In accordance with the concepts described herein, the present disclosure provides exemplary infinite RF DLL devices and methods that comprise a source-agnostic RF DLL.

In accordance with the concepts described herein, the present disclosure provides exemplary infinite RF DLL devices and methods comprising one phase detector, one infinite phase shift actuator, and one actuator controller.

In accordance with the concepts described herein, the present disclosure provides exemplary infinite RF DLL devices and methods that comprise one feedback loop.

In accordance with the concepts described herein, the present disclosure provides exemplary infinite RF DLL devices and methods, where an infinite phase shift actuator comprises an in-phase/quadrature (I/O) mixer.

In accordance with the concepts described herein, the present disclosure provides exemplary infinite RF DLL devices and methods, where an infinite phase shift actuator comprises an RF bridge.

In accordance with the concepts described herein, the present disclosure provides exemplary infinite RF DLL devices and methods that operate in a microwave domain.

In accordance with the concepts described herein, the present disclosure provides exemplary infinite RF DLL devices and methods that exhibit low noise.

In accordance with the concepts described herein, the present disclosure provides exemplary infinite RF DLL devices and methods operate continuously without any abrupt switching.

In accordance with the concepts described herein, the present disclosure provides exemplary infinite RF DLL devices and methods that may be precisely controlled and/or calibrated.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1:
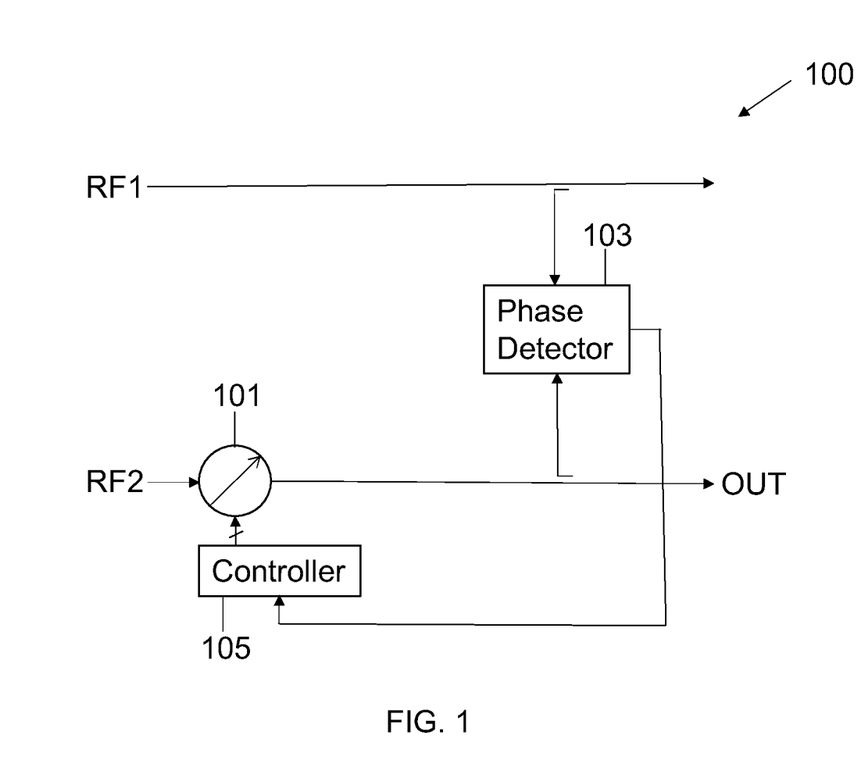
FIG. 1 is an illustration of a generic embodiment of an infinite RF DLL.

FIG. 1 is an illustration of an example embodiment of an infinite RF DLL 100 configured to receive a first RF signal RF1 and a second RF signal RF2. In an example embodiment, the RF DLL 100 comprises an infinite phase shifter 101, a phase detector 103, and a controller 105.

The infinite RF DLL device 100 may comprise an external stand-alone component as compared to a conventional device that incorporates a DLL or PLL internal to the signal source.

The infinite phase shifter 101 has a first input for receiving the second RF signal RF2, a bus input for receiving at least one control signal from the controller 105, and an output OUT. The phase detector 103 has a first RF connection for receiving at least a portion of the first RF signal RF1, a second RF connection for receiving a portion of the output of the infinite phase shifter 101, and an output.

The controller 105 has an input connected to the output of the phase detector 103 and at least one output connected to the bus input of the infinite phase shifter 101. The output OUT of the infinite phase shifter 101 provides a low noise signal that is in phase alignment with the first RF signal RF1.

Figure 2:
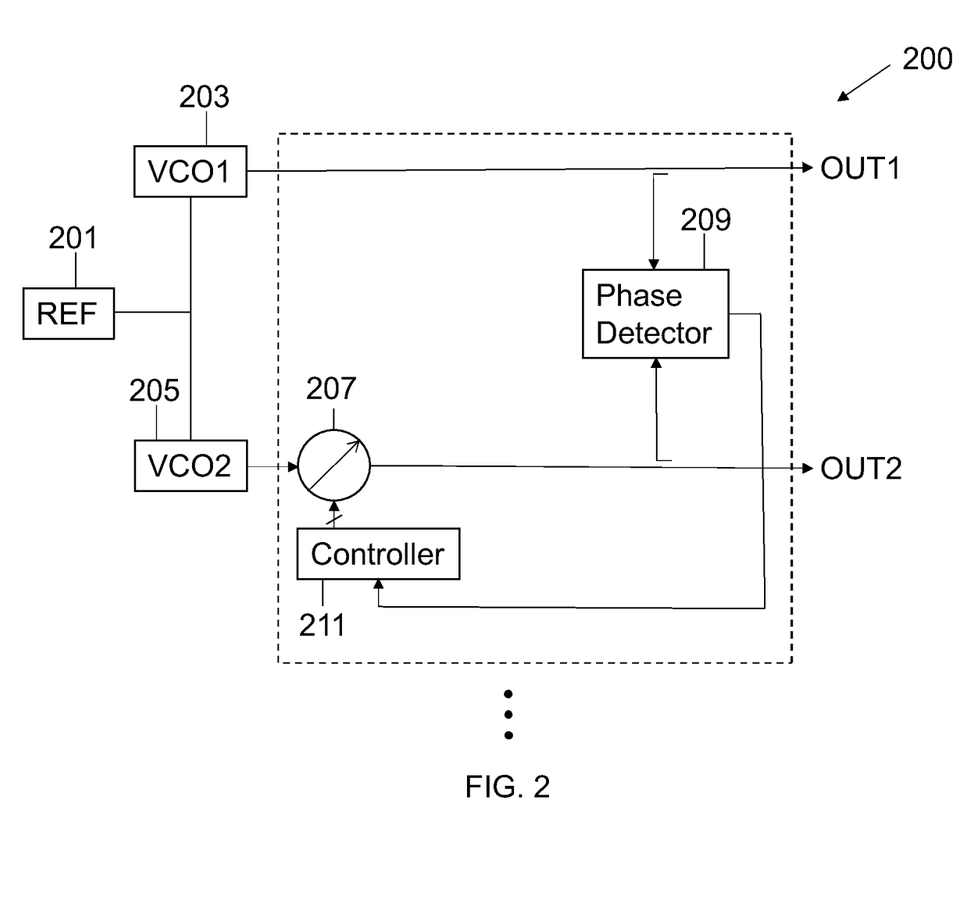
FIG. 2 is an illustration of the generic embodiment of an infinite RF DLL used to phase-lock two external VCOs.

FIG. 2 is an illustration of an example embodiment of system having an infinite RF DLL 200 configured to receive first and second VCO inputs. In an example embodiment, the system comprises a reference device 201, a first VCO 203, and a second VCO 205. The DLL includes an infinite phase shifter 207, a phase detector 209, and a controller 211.

The reference device 201 outputs an oscillating voltage reference signal. The first VCO 203 has an input connected to the output of the reference device 201 and an output OUT1 for providing a first RF signal. The second VCO 205 has an input connected to the output of the reference device 201 and an output for providing a second RF signal. The VCOs are phase-locked to the common reference signal independently using internal PLLs.

Although VCOs 203 and 205 are phase locked to a common reference 201, the phase alignment may be inadequate for purposes such as coherent carrier addition when narrow bandwidth internal PLLs are used. The infinite RF DLL provides a completely external means to achieve precise phase alignment. In example embodiments, feedback is not provided to the VCOs 203, 205 from the phase detector 209 as in conventional PLLs. In embodiments, at least one of the VCO outputs is post-processed and phase-aligned with the other of the VCO outputs. With this arrangement, an external DLL can be coupled to various input signals and provide phase-aligned signals.

Figure 3:
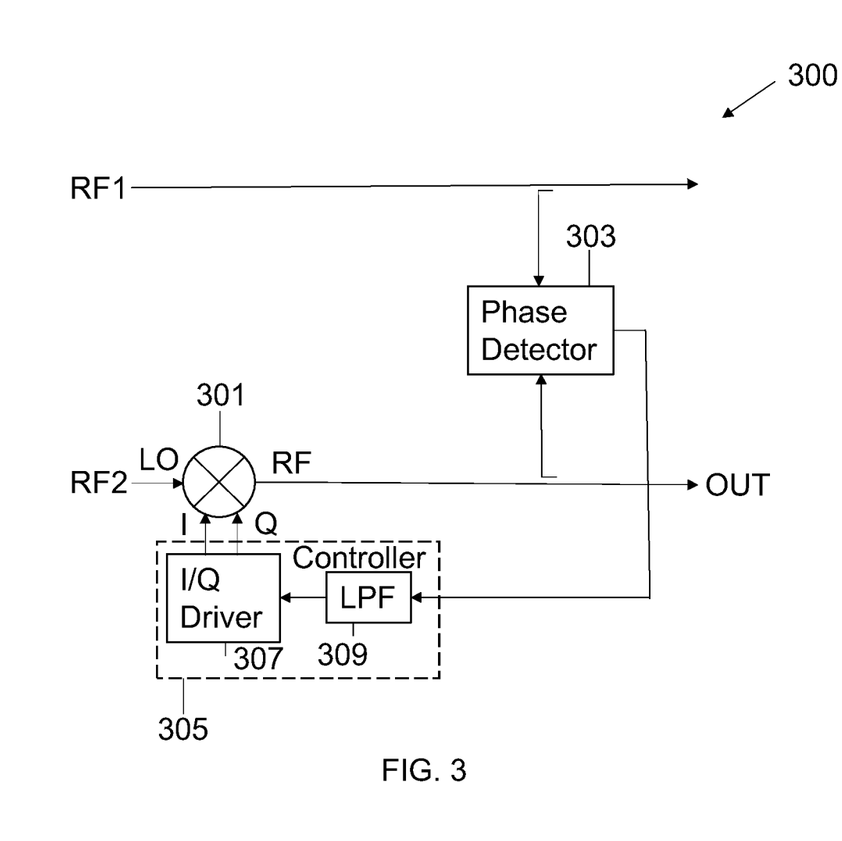
FIG. 3 is an illustration of an example embodiment of an infinite RF DLL with an I/O mixer as an infinite phase shifter.

FIG. 3 is an illustration of an example embodiment of an infinite RF DLL 300 with an I/Q mixer 301 as an infinite phase shifter. In an example embodiment, the RF DLL 300 comprises the I/Q mixer 301, a phase detector 303, and a controller 305.

The I/Q mixer 301 has a first input for receiving a second RF signal RF2 as a local oscillator signal (LO), a bus input receiving both an I control signal and a Q control signal from the controller 305, and an output OUT for providing an RF signal. The phase detector 303 has a first RF connection for receiving at least a portion of the first RF signal RF1 and a second RF connection for receiving at least a portion of the RF output OUT of the I/Q mixer 301, and an output that is an intermediate frequency (IF) signal. Power is incident on the first input of the I/Q mixer 301. A phase-shifted output appears on the output OUT of the I/Q mixer 301. Phase of the output OUT is steered using the bus input (the I and Q signals) of the I/Q mixer 301.

The controller 305 has an input connected to the output of the phase detector 303 and respective outputs connected to the bus input of the I/Q mixer 301 for providing the I and Q control signals. The output OUT of the I/Q mixer 301 provides a low noise signal that is in phase alignment with the first RF signal RF1.

In an example embodiment, the controller 305 comprises a low pass filter 309 and an IQ driver 307. The low pass filter 309 has an input connected to the output of the phase detector 303 and an output. The I/Q driver 307 has an input connected to the output of the low pass filter 309 and two outputs connected to the two inputs of the I/Q mixer 301 for providing the I and Q control signals.

The controller can use analog-to-digital converters to sample the phase detector output, and digital-to-analog converters to drive the I/Q ports of the infinite phase shifter. The controller can use closed-loop digital feedback algorithms to operate the system.

The controller can be constructed of analog feedback components to generate I/Q control voltages in response to the phase detector output.

Figure 4:
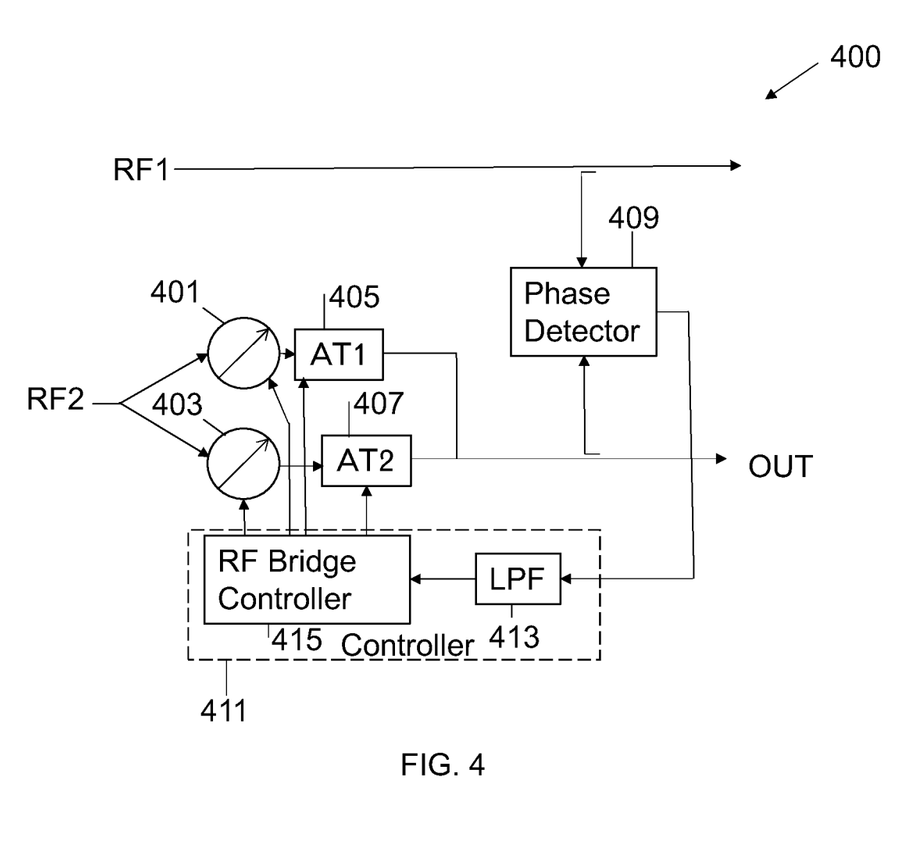
FIG. 4 is an illustration of an example embodiment of an infinite RF DLL with an RF bridge as an infinite phase shifter.

FIG. 4 is an illustration of an example embodiment of an infinite RF DLL 400 with an RF bridge as an infinite phase shifter. In an example embodiment, the infinite RF DLL 400 comprises a first phase shifter 401, a second phase shifter 403, a first attenuator 405, a second attenuator 407, a phase detector 409, and a controller 411.

A least a portion of a first RF signal RF1 is provided to the phase detector 409. The first phase shifter 401 has a first input for receiving a portion of the second RF signal RF2, a second input signal for receiving a control signal from the controller 411, and an output. The second phase shifter 403 has a first input for receiving a portion of the second RF signal RF2, a second input for receiving a control signal from the controller 411, and an output. Incident power is split down two arms, where the first arm comprises the first phase shifter 401 and the attenuator 405 and the second arm comprises the second phase shifter 403 and the second attenuator 407. Each arm has a >360 phase shifter and a voltage-variable attenuator. In an example operation only one of the arms is active, the attenuator of the other arm being set to provide high attenuation. When the phase drift of output signal OUT described below is about to go beyond a limit of the active phase shifter, the other phase shifter is set to an appropriately selected starting position and the corresponding attenuation is reduced.

The first attenuator 405 has a first input connected to the output of the first phase shifter 401, a second input connected to the controller 411, and an output. The second attenuator 407 has a first input connected to the output of the second phase shifter 403, a second input connected to the controller 411, and an output. The outputs of the first attenuator 405 and the second attenuator 407 are combined and provide an RF signal OUT.

The phase detector 409 has a first RF connection for receiving at least a portion of the first RF signal RF1, a second RF connection for receiving at least a portion of the RF signal OUT of the first attenuator 405 and the second attenuator 407, and an output.

The controller 411 has an input connected to the output of the phase detector 409, a first output signal connected to the second input of the first phase shifter 401, a second output signal connected to the second input of the second phase shifter 403, a third output connected to the second input of the first attenuator 405, and a fourth output connected to the second input of the second attenuator 407. The output signal OUT being a combination of the outputs of the first attenuator 405 and the second attenuator 407 provides a low noise signal that is in phase alignment with the first RF signal RF1.

In an example embodiment, the controller 411 comprises a low pass filter 413 and an RF bridge controller 415. The low pass filter 413 has an input connected to the output of the phase detector 409 and an output. The RF bridge controller 415 has an input connected to the output of the low pass filter 413, a first output connected to the second input of the first phase shifter 401, a second output connected to the second input of the second phase shifter 403, a third output connected to the second input of the first attenuator 405, and a fourth output connected to the second input of the second attenuator 407.

Figure 5:
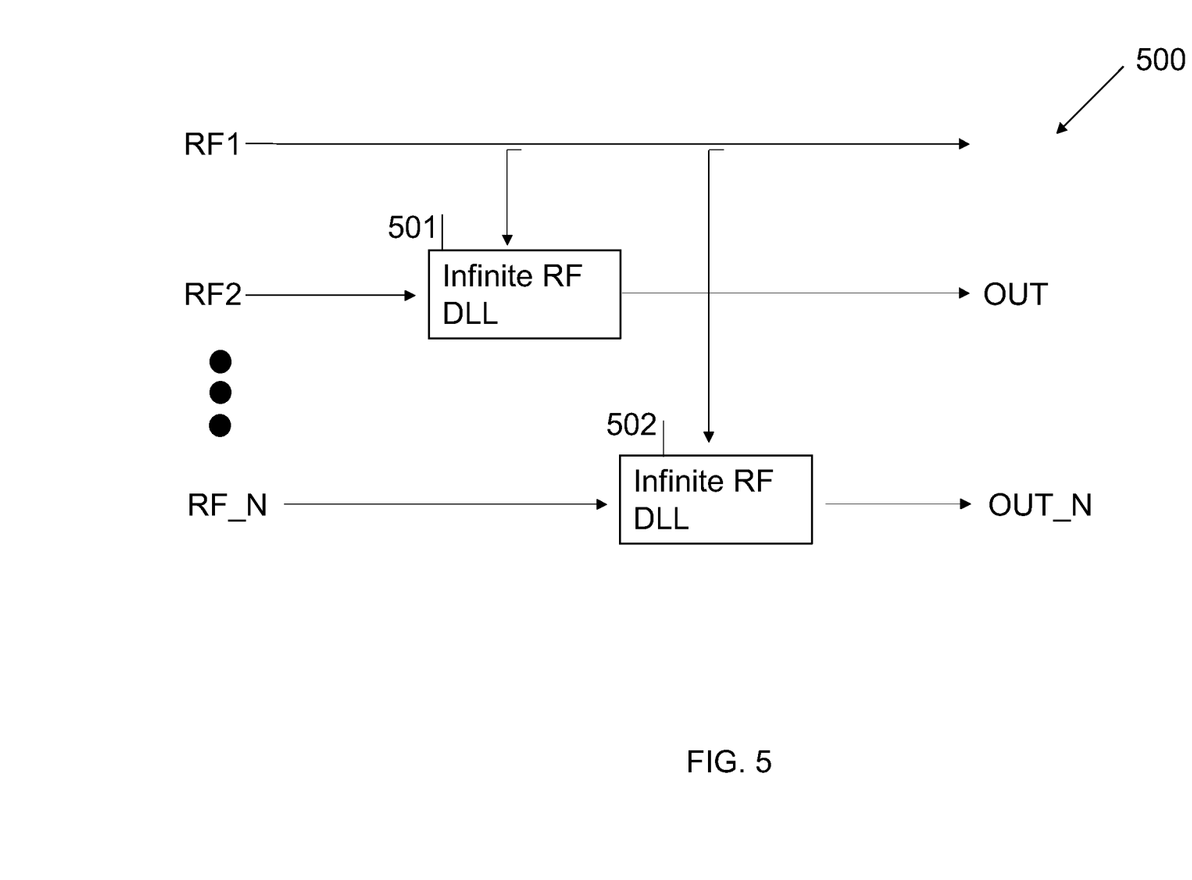
FIG. 5 is an illustration of a generic multi-input/multi-output infinite RF DLL.

FIG. 5 is an illustration of a multi-input/multi-output infinite RF DLL embodiment. The typical infinite RF DLL 501 aligns signal RF2 to signal RF1. Any number of additional signals RF_N can also be aligned with additional infinite RF DLLs 502. The external nature enables scalable distributed clock synchronization.

Figure 6:
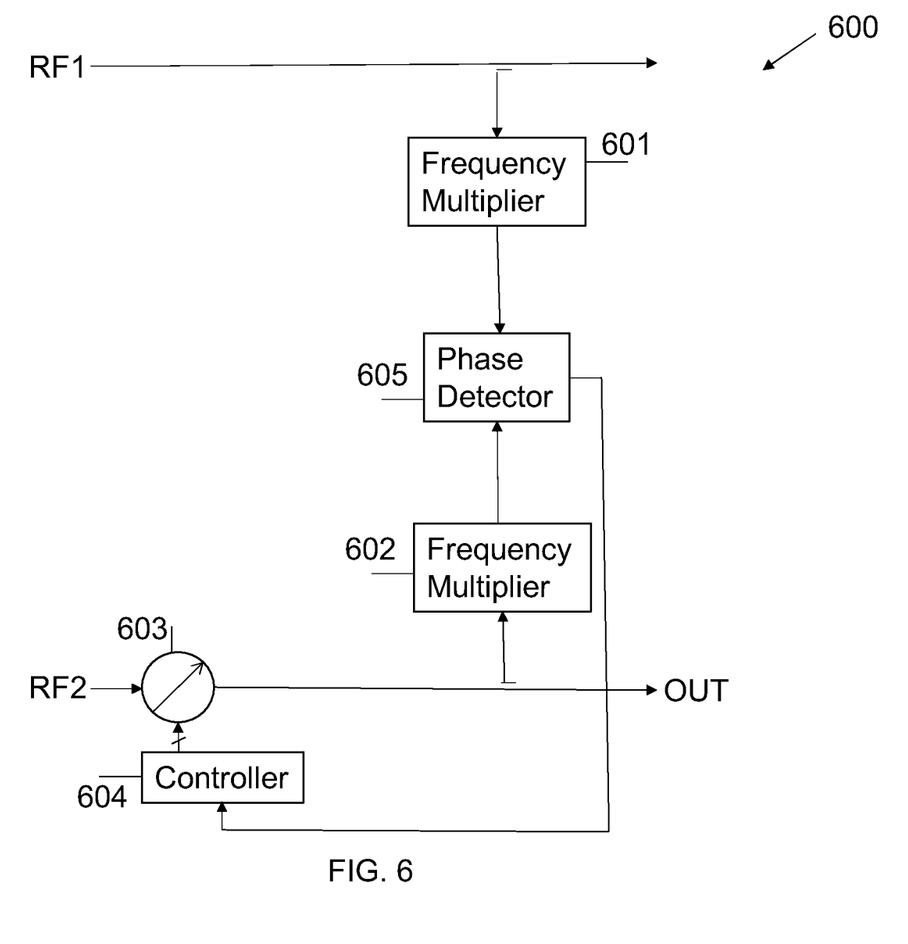
FIG. 6 is an illustration of an infinite RF DLL using frequency multiplier(s)

FIG. 6. is an illustration of an example embodiment that uses frequency multipliers (or dividers) to use the infinite RF DLL to phase-lock signals of different frequencies. An infinite RF DLL 600 is constructed with a phase detector 605, a controller 604, and an infinite phase actuator 603. Frequency multipliers are placed in either the phase detector reference arm 601, the phase detector feedback arm 602, or both.

Figure 7:
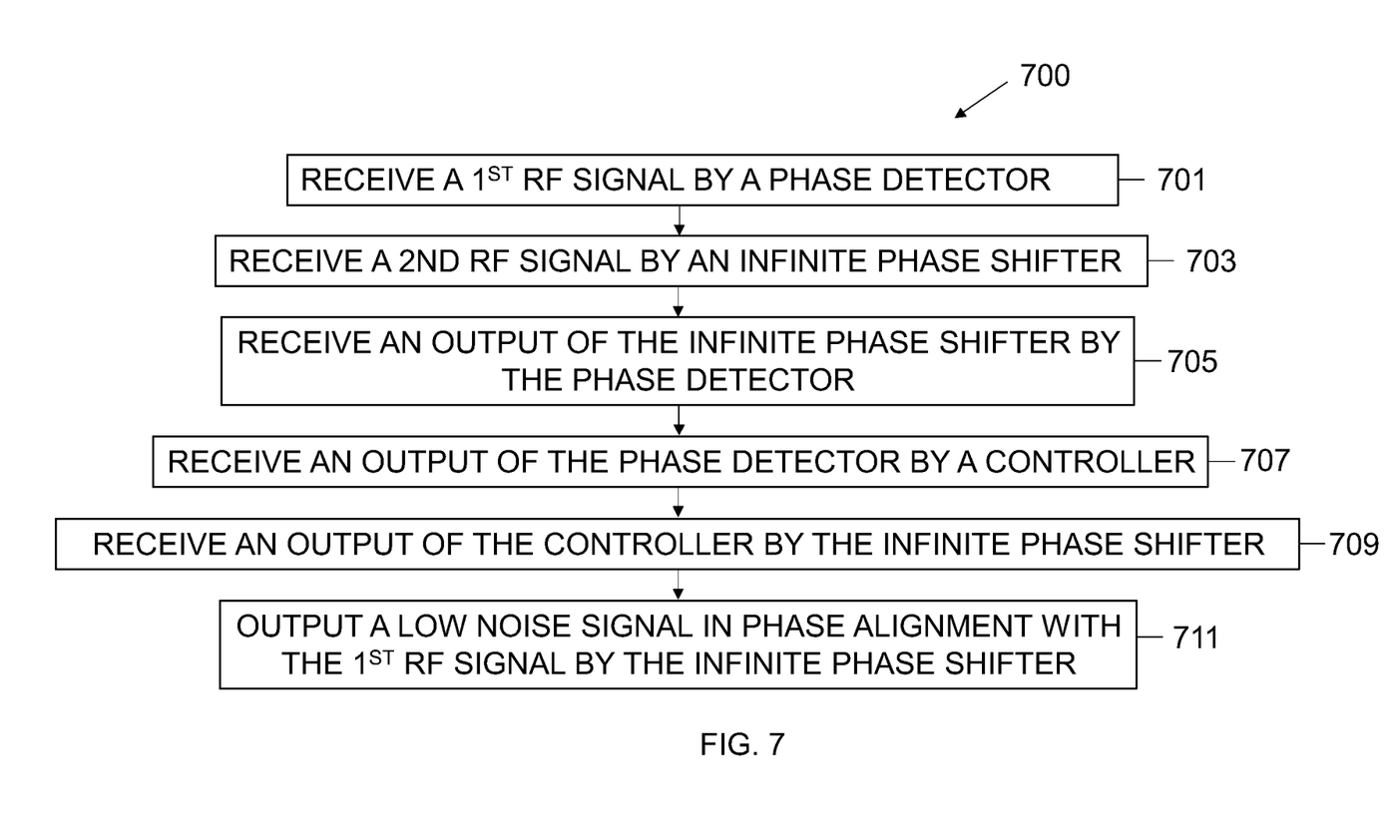
FIG. 7 is a flowchart of the generic embodiment of an infinite RF DLL.

FIG. 7 is a flowchart of an example method 700 of an infinite RF DLL in accordance with the concepts described herein. In an example embodiment, the method 700 comprises receiving a first RF signal by a phase detector in step 701.

Step 703 of the method 700 comprises receiving a second RF signal by an infinite phase shifter. Step 705 of the method 700 comprises receiving an output of the infinite phase shifter by the phase detector. Step 707 of the method 700 comprises receiving an output of the phase detector by a controller. Step 709 of the method 700 comprises receiving an output of the controller by the infinite phase shifter. Step 711 of the method 700 comprises outputting a low noise signal in phase alignment with the first RF signal by the infinite phase shifter.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

Various embodiments of the concepts, systems, devices, structures and techniques sought to be protected are described herein with reference to the related drawings. As noted above, in embodiments, the concepts and features described herein may be embodied in a digital multi-beam beamforming system. Alternative embodiments can be devised without departing from the scope of the concepts, systems, devices, structures and techniques described herein.

It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, terms such as "upper," "lower," "right," "left," "vertical," "horizontal, "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A radio frequency (RF) delay-locked loop (DLL), comprising:
    a phase detector having a first input configured to receive a first RF signal, a second input, and an output;
    an infinite phase shifter having a first input configured to receive a second RF signal, an input bus, and an output connected to the second input of the phase detector; and
    a controller having a first input connected to the output of the phase detector and an output bus connected to the input bus of the infinite phase shifter,
    wherein the output of the phase shifter comprises a low noise signal in phase alignment with the first RF signal.

2. The device of claim 1, further comprising:
    a reference signal device having an output;
    a first voltage controlled oscillator (VCO) having an input connected to the output of the reference signal device, and an output connected to the first input of the phase detector and configured to provide the first RF signal; and
    a second VCO having an input connected to the output of the reference signal device, and an output connected to the first input of the phase detector and configured to provide the first RF signal.

3. The device of claim 1, wherein the infinite phase shifter comprises an in-phase/quadrature (I/Q) mixer having a first input configured to receive the second RF signal, a second input configured to receive an I control signal, a third input configured to receive a Q control signal, and an output configured to provide the low noise signal in phase with the first RF signal.

4. The device of claim 3, wherein the controller comprises:
    a low pass filter having an input connected to the output of the phase detector, and an output; and
    an I/Q driver having an input connected to the output of the low pass filter, a first output connected to the second input of the I/Q mixer and configured to provide the I control signal, and a second output connected to the third input of the I/Q mixer and configured to provide the Q control signal.

5. The device of claim 1, wherein the infinite phase shifter comprises an RF bridge comprising:
    a first phase shifter having a first input configured to receive the second RF signal, an input bus, and an output;
    a first attenuator, having a first input connected to the output of the first phase shifter, a second input, and an output;
    a second phase shifter having a first input configured to receive the second RF signal, an input bus, and an output;
    a second attenuator, having a first input connected to the output of the second infinite phase shifter, a second input, and an output.

6. The device of claim 5, wherein the controller comprises:
    a low pass filter having an input connected to the output of the phase detector, and an output; and
    an RF bridge controller having an input connected to the output of the low pass filter, a first output bus connected to the input bus of the first phase shifter, a second output bus connected to the input bus of the second phase shifter, a first output connected to the second input of the first attenuator, and a second output connected to the second input of the second attenuator.

7. The device of claim 6, wherein the first attenuator and the second attenuator each comprise a voltage-variable attenuator.

8. The device of claim 1, wherein any number of devices are cascaded to achieve phase alignment of multiple signals.

9. The device of claim 1, wherein frequency multipliers or dividers are used in either the phase detector reference arm, the phase detector feedback arm, or both.

10. A method of an infinite radio frequency (RF) delay-locked loop (DLL), comprising:
    receiving a first RF signal by a phase detector;
    receiving a second RF signal by an infinite phase shifter;
    receiving an output of the infinite phase shifter by the phase detector;
    receiving an output of the phase detector by a controller;
    receiving an output of the controller by the infinite phase shifter; and
    outputting a low noise signal in phase alignment with the first RF signal by the infinite phase shifter.

11. The method of claim 10, further comprising:
    a reference signal device having an output;
    a first voltage controlled oscillator (VCO) having an input connected to the output of the reference signal device, and an output connected to the first input of the phase detector and configured to provide the first RF signal; and
    a second VCO having an input connected to the output of the reference signal device, and an output connected to the first input of the phase detector and configured to provide the first RF signal.

12. The method of claim 10, wherein the infinite phase shifter comprises an in-phase/quadrature (I/Q) mixer having a first input configured to receive the second RF signal, a second input configured to receive an I control signal, a third input configured to receive a Q control signal, and an output configured to provide the low noise signal in phase with the first RF signal.

13. The method of claim 12, wherein the controller comprises:
    a low pass filter having an input connected to the output of the phase detector, and an output; and
    an I/Q driver having an input connected to the output of the low pass filter, a first output connected to the second input of the I/Q mixer and configured to provide the I control signal, and a second output connected to the third input of the I/Q mixer and configured to provide the Q control signal.

14. The method of claim 10, wherein the infinite phase shifter comprises an RF bridge comprising:
   a first infinite phase shifter having a first input configured to receive the second RF signal, an input bus, and an output;
   a first attenuator, having a first input connected to the output of the first infinite phase shifter, a second input, and an output;
   a second infinite phase shifter having a first input configured to receive the second RF signal, an input bus, and an output;
   a second attenuator, having a first input connected to the output of the second infinite phase shifter, a second input, and an output.

15. The method of claim 14, wherein the controller comprises:
   a low pass filter having an input connected to the output of the phase detector, and an output; and
   an RF bridge controller having an input connected to the output of the low pass filter, a first output bus connected to the input bus of the first infinite phase shifter, a second output bus connected to the input bus of the second infinite phase shifter, a first output connected to the second input of the first attenuator, and a second output connected to the second input of the second attenuator.

16. The method of claim 14, wherein the first attenuator and the second attenuator each comprise a voltage-variable attenuator.

* * * * *